United States Patent [19]
Katoozi et al.

[11] Patent Number: 5,594,631
[45] Date of Patent: Jan. 14, 1997

[54] DIGITAL PULSE WIDTH MODULATOR FOR POWER SUPPLY CONTROL

[75] Inventors: Mehdi Katoozi; George S. La Rue, both of Bellevue, Wash.

[73] Assignee: The Boeing Company, Seattle, Wash.

[21] Appl. No.: 230,320

[22] Filed: Apr. 20, 1994

[51] Int. Cl.$^6$ .................................................. H02M 1/12
[52] U.S. Cl. .............................................. 363/41; 323/283
[58] Field of Search ........................ 363/41, 43, 39, 363/95; 318/801, 811; 323/283, 284, 351

[56] References Cited

U.S. PATENT DOCUMENTS

| | | | |
|---|---|---|---|
| 3,978,393 | 8/1976 | Wisner et al. | 323/17 |
| 4,095,165 | 6/1978 | Boros | 323/283 |
| 4,109,194 | 8/1978 | Miller | 323/283 |
| 4,634,903 | 1/1987 | Montorfano | 307/571 |
| 4,638,417 | 1/1987 | Martin, Jr. et al. | 363/41 |
| 5,079,498 | 1/1992 | Cleasby et al. | 323/283 |
| 5,475,581 | 12/1995 | Lansberry | 363/41 |

*Primary Examiner*—Peter S. Wong
*Assistant Examiner*—Adolf Berhane
*Attorney, Agent, or Firm*—Christensen, O'Connor, Johnson & Kindness PLLC

[57] ABSTRACT

A control for a pulse width modulated power supply. The control (14) uses a digital pulse width modulator (48, 48') to produce set and reset signals that determine the duration of control pulses supplied to the pulse width modulated power supply (12). In one embodiment, a plurality of analog-to-digital converters (50, 51, 53) convert analog signals indicative of different parameters monitored on the pulse width modulated power supply to digital values. Differences between the digital values and corresponding predefined desired reference values are determined, combined, and the result is input to a digital comparator (72) of the digital pulse width modulator. The digital comparator produces a reset signal when the combined differences equal a count of clock pulses accumulated on a counter (76). A second digital comparator compares the count to a predefined count and produces a set signal when the two digital values are equal. The set and reset signals are applied to a flip-flop (88) to produce the control pulses, and the set signal resets the counter to initiate the next count cycle. In a silicon CMOS embodiment having a limited switching frequency capability, the required resolution is achieved by using a vernier (94) to incrementally delay the reset signal based upon the least significant bits of the difference signal.

27 Claims, 8 Drawing Sheets

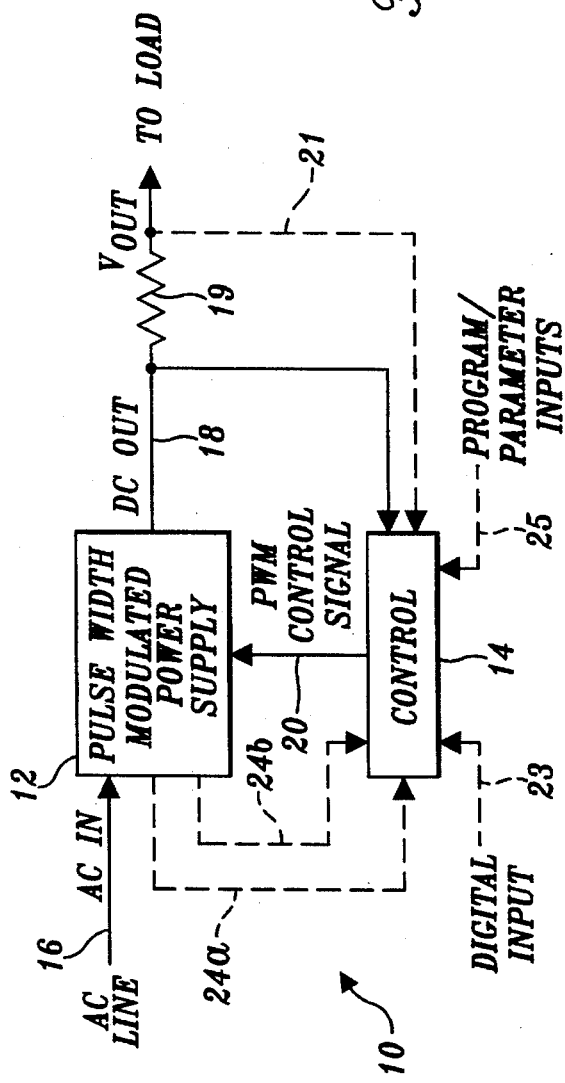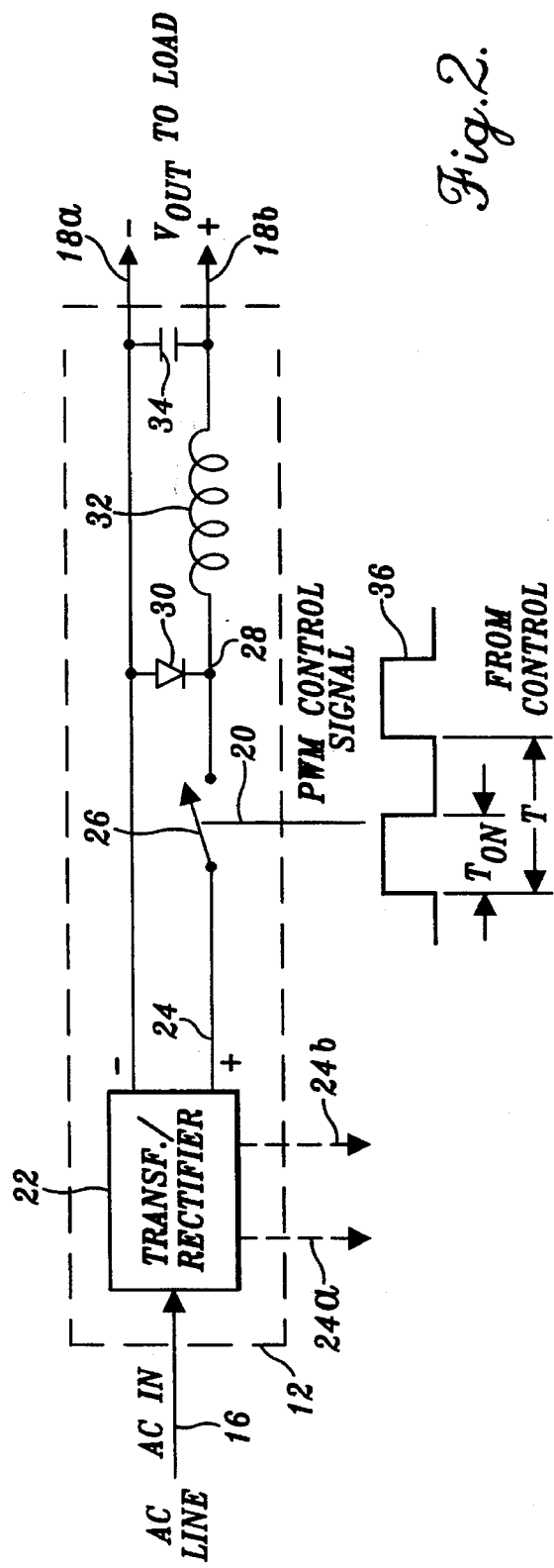

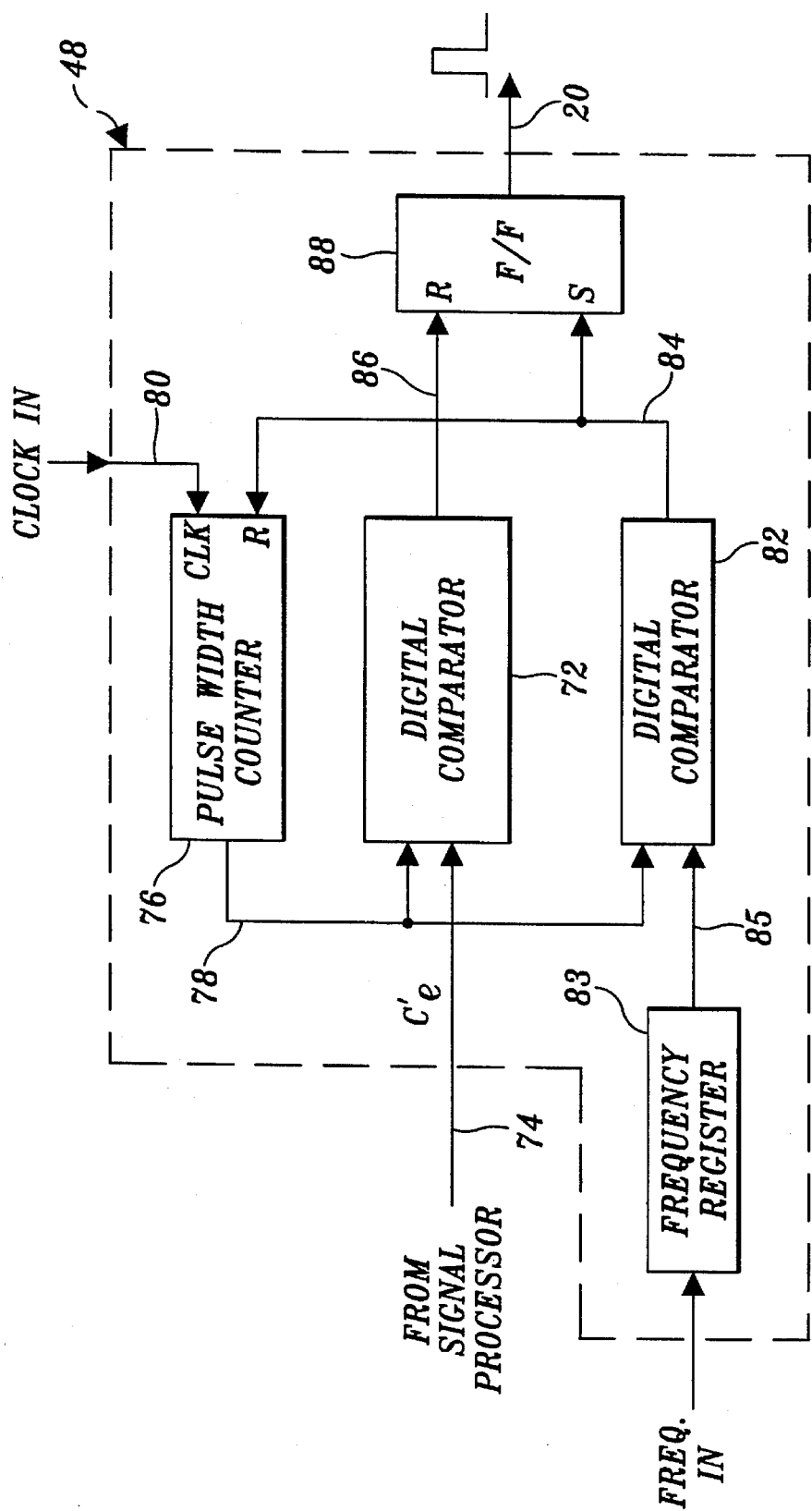

5,594,631

DIGITAL PULSE WIDTH MODULATOR FOR POWER SUPPLY CONTROL

FIELD OF THE INVENTION

This invention generally pertains to a pulse width modulated power supply, and more specifically, to a control that provides a control signal to such a power supply, the control signal having a pulse width adjusted so as to maintain a desired output voltage from the power supply.

BACKGROUND OF THE INVENTION

Switching power supplies have become ubiquitous as the power supply design of choice for many types of devices, from laser printers to avionics instrumentation. The relative simplicity, efficiency, and low cost of switching power supplies have led to the growth in their popularity. One of the reasons that this type power supply is economical to build is that pulse width modulation integrated circuits (ICs) designed to regulate the direct current (DC) output voltages that they produce are now available at relatively low cost from several sources. These pulse width modulation ICs are analog devices that provide a variable pulse width modulated control signal in response to the magnitude of the output voltage of the power supply. The pulse width modulation of the control signal determines the time interval during which a charging current is applied to a relatively high valued capacitor that serves as a source of the output voltage of the switching power supply. An electronic switch actuated by the control signal closes to charge the capacitor during the interval of the pulse. The pulse width of the control signal is thus varied to modulate the voltage on the capacitor, thereby achieving a desired DC output voltage from the switching power supply.

In addition to performing an output voltage regulation function, pulse width modulation ICs have been designed to solve other problems associated with a switching power supply, some of which arise due to the analog nature of the control scheme. For example, it is desirable to provide a "soft" startup when a switching power supply is first energized, to avoid high inrush currents that occur when the capacitor is initially charged. The inrush current is preferably limited by the pulse width modulation IC during startup. Other desirable functions of the pulse width modulation IC are blanking the leading edge of a current sense signal to suppress spurious switching spikes, and loop compensation of an amplifier that determines the error or deviation of the output voltage from a desired value. Loop compensation typically requires adding several passive components that are coupled to the input and output of the amplifier.

There are several disadvantages to the analog implementation of the pulse width modulation IC commonly used with switching power supplies compared to what could be accomplished using a digital pulse width modulation control. A digital control of this type would have reduced temperature sensitivity, ensuring that the output voltage is less affected by temperature changes. The frequency of the pulse width modulated control signal can be more tightly controlled in a digitally implemented control than in an analog system, so that relatively smaller induction coils can be used. Since the digital control can programmed, the output voltage, soft-start behavior and output voltage control limits can readily be set with digital values. A digital pulse width modulated control with digital signal processing also enables more flexible and faster control of pulse width in response to changes in load. In most cases, the digital control should provide reduced power consumption, size, and cost, compared to an analog pulse width modulation control. Finally, digital controls can be configured to improve the ease with which the devices are tested by providing built-in diagnostic routines.

SUMMARY OF THE INVENTION

In accordance with the present invention, a control for a pulse width modulated power supply is defined that includes an analog-to-digital converter having an input adapted to monitor a parameter of the pulse width modulated power supply, producing a corresponding digital signal. A reference register stores a reference value that is determined as a function of a desired value of the parameter for the pulse width modulated power supply. Also included is an adder having a first input coupled to the analog-to-digital converter to receive the digital signal and a second input coupled to the reference register to receive the reference value stored therein. The adder determines a digital error signal corresponding to a difference between the digital signal and the reference value.

Also included in the control are a clock that produces a clock signal comprising a plurality of pulses, and a counter, which has an input coupled to the clock to receive the clock signal. The counter produces a digital count of the pulses comprising the clock signal. A digital comparator having an output, a first input coupled to receive the digital error signal, and a second input coupled to receive the digital count produces a reset signal on its output when the digital count equals the digital error signal. The reset signal is applied to an input of a gate circuit; an output of the gate circuit produces a control pulse having a width determined as a function of the reset signal. The magnitude of the analog voltage produced by a pulse width modulated power supply coupled to receive the control pulse is then determined by the width of the control pulse.

The control further includes at least one other analog-to-digital converter (ADC) adapted to couple to the pulse width modulated power supply. The one or more ADCs each monitor a different parameter indicative of the operation of the pulse width modulated power supply and produce a different digital signal indicative of the parameter monitored. In addition, at least one other reference register is provided. The reference registers each store a register value corresponding to a desired value for one of the parameters.

Also provided are means for combining the plurality of different parameters of the pulse width modulated power supply that are being monitored. The parameters monitored preferably include at least one of an input voltage, an input current, an output voltage, and an output current of the pulse width modulated power supply.

A multiplier is coupled to the output of the adder to receive the error signal, and in one form of the invention, an automatic gain control is coupled to the output of the analog-to-digital converter to receive the digital signal. In response to the digital signal, the automatic gain control provides a gain value that is input to the multiplier for multiplying the error signal to produce a multiplied error signal that is supplied to the first input of the digital comparator. In one embodiment, the gain value is proportional to a magnitude of the digital signal produced by the analog-to-digital converter.

The control further includes means for producing a set signal. The set signal is coupled to a set terminal of the gate circuit to initiate the control pulse, and to a reset terminal of the counter to initiate its digital count. The gate circuit preferably comprises a flip flop.

In one embodiment of the invention, the error signal comprises a plurality of bits, ranging from a least significant bit to a most significant bit. In this embodiment, the invention also includes a vernier coupled between the output of the digital comparator and the input of the gate circuit. This vernier receives the least significant bits of the error signal, and in response thereto, delays the reset signal by a time interval having a duration corresponding to a value of the least significant bits. The vernier thereby provides greater resolution in controlling the width of the control pulse. Preferably, the vernier includes a plurality of delay elements coupled to a multiplexer. The multiplexer responds to the least significant bits of the error signal to select a specific number of delay elements to apply in delaying the reset signal, each delay element providing an incremental delay to the reset signal.

Another aspect of the present invention is directed to a method for controlling a pulse width modulated power supply. This method includes steps that are generally consistent with the functions implemented by the elements comprising the control discussed above.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a block diagram showing a pulse width modulated power supply controlled by the present invention;

FIG. 2 is a schematic diagram of the pulse width modulated power supply of FIG. 1;

FIG. 4B is schematic diagram of a first embodiment of a digital pulse width modulator used in the control of FIG. 3;

DETAILED DESCRIPTION OF THE PREFERRED EMBODIMENT

Figure 3:
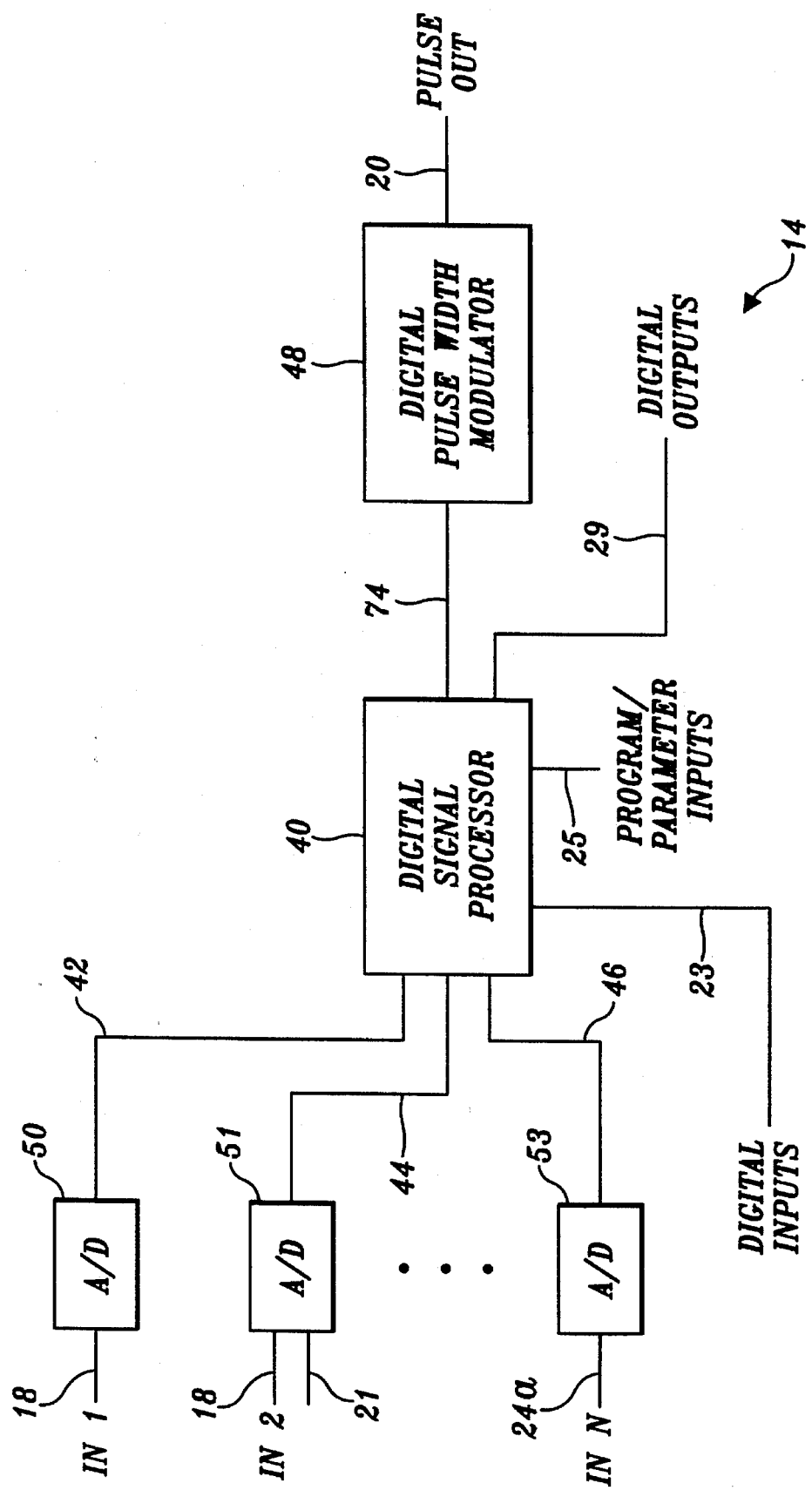
FIG. 3 is a block diagram of the pulse width modulated power supply control, in accordance with the present invention, illustrating how a plurality of different parameters of the pulse width modulated power supply can be simultaneously monitored and combined to control the power supply.

With reference to FIG. 1, a simplified block diagram 10 illustrates how a control 14, configured in accordance with the present invention, is coupled to control a generally conventional pulse width modulated switching power supply 12. The pulse width modulated switching power supply is provided with an alternating current (AC) signal on a line 16, from an external AC line (not shown). Alternatively, direct current (DC) can be supplied on line 16 from a DC source, such as a battery (not shown). It will thus be apparent that the present invention is useful in controlling pulse width modulation of switching power supplies, regardless of the type or source of the power input to the switching power supply.

Control 14 can monitor one or more of a plurality of parameters of pulse width modulated switching power supply 12 for use in controlling the pulse width modulated switching power supply. These parameters include: a DC output voltage, $V_{OUT}$, which is conveyed to a connected load (not shown) and applied to control 14 on a line 18; an output current that is determined by monitoring a voltage drop across a shunt resistor 19, which is coupled to line 18, the voltage drop across the shunt resistor being conveyed to control 14 on lines 18 and 21; an input voltage that is conveyed to control 14 on a line 16, and an input current that is determined by monitoring the current through a transformer secondary tap (not separately shown) in a transformer/rectifier circuit 22 (FIG. 2). The signal indicative of input current is conveyed from transformer/rectifier circuit 22 to the control on lines 24a and 24b. Program variables affecting the operation of control 14 are determined by user supplied data input to control 14 through lines 25. In response to the parameter(s) monitored, control 14 provides a pulse width modulated (PWM) control signal on a line 20 that controls the operation of PWM switching power supply 12.

Referring now to FIG. 2, it will be evident how the PWM control signal provided over line 20 controls the output voltage supplied to the load. In the PWM switching power supply, the AC input signal is converted to DC by transformer/rectifier circuit 22. In the event that a DC power source is used instead of AC, transformer/rectifier circuit 22 is not required and can be replaced with a simple shunt resistor (not shown) in line 24, so that input current can be monitored as a function of the voltage drop across the shunt resistor.

The negative DC potential of the voltage provided by or output from transformer/rectifier circuit 22 is conveyed on a line 18a that extends through PWM switching power supply 12, while the positive potential of the voltage provided by transformer/rectifier circuit 22 is conveyed by a line 24 to an electronically controlled switch 26. Electronically controlled switch 26 is actuated by the PWM control signal supplied by control 14 (in FIG. 1). As shown in FIG. 2, the PWM control signal comprises a square wave signal 36 having a period, T, including a positive-going pulse portion that extends over an on-time, $T_{ON}$. Electronically controlled switch 26 is closed by the leading edge of the positive-going pulse portion of square wave signal 36, so that electrical current is conducted through the electronically controlled switch during the on-time, $T_{ON}$. Current flowing through electronically controlled switch 26 is conveyed through a line 28, which is coupled to the cathode of a diode 30, the anode of which is connected to line 18a. Line 28 is also coupled to one terminal of an inductor 32. The opposite terminal of inductor 32 is electrically coupled to a capacitor 34, which is connected between line 18a and a line 18b. Inductor 32 and capacitor 34 filter the pulses of DC developed as electronic switch 26 opens and closes under the control of the PWM control signal. Diode 30 conducts any reverse potential inductive current spikes produced when electronically controlled switch 26 opens.

By varying the duration of the on-time, $T_{ON}$, relative to the total period, T, of square wave signal 36, control 14 determines the charge on capacitor 34, and thus, the magnitude of the output voltage, $V_{OUT}$. It should be apparent that the PWM control signal provided by control 14 can also be used to control the output current (through shunt resistor 19), the input voltage, and/or the input current of PWM switching power supply 12, depending upon the combination of one or more of these parameters that are monitored by control 14.

Functional components of control 14 are shown in FIG. 3. It should be noted that while control 14 is preferably configured to simultaneously monitor a combination of the parameters indicative of the operation of the PWM switching power supply for use as a basis in providing the PWM control signal, alternatively, if less flexibility in the control of the PWM switching power supply is acceptable, an input for monitoring only a single parameter need be provided.

The signals indicative of the various parameters of the PWM switching power supply that can be monitored are each separately input to a different one of a plurality of analog-to-digital converters (ADCs) 50, 51, . . . , 53 for conversion to a corresponding digital value. One of the significant benefits of control 14 is that unlike conventional analog controls for PWM power supplies, it operates in the digital domain. By operating in the digital domain, substantially better temperature stability and relatively lower manufacturing costs can be achieved, compared to conventional analog controls. One advantage of its digital operation is the ease with which several parameters being monitored can be processed. The digital outputs of the ADCs are input to different ports of a digital signal processor 40 on lines 42, 44, . . . , 46. Signal processor 40 is programmed by the user to respond to all of the digital signals applied to its ports for processing so that the PWM switching power supply is controlled as a function of each of the operating parameters monitored. The processing applied to the digital signal(s) input to signal processor 40 is described below.

Signal processor 40 produces a digital error count, $C_e'$, which is input to a digital pulse width modulator 48 on lines 74. Based upon a comparison of the value, $C_e'$, with a running count of clock pulses that are input on a line 80 (FIG. 4B) from an external clock (not shown), e.g., from a crystal oscillator, the PWM control signal is developed and output from digital pulse width modulator 48 on line 20.

Figure 4A:
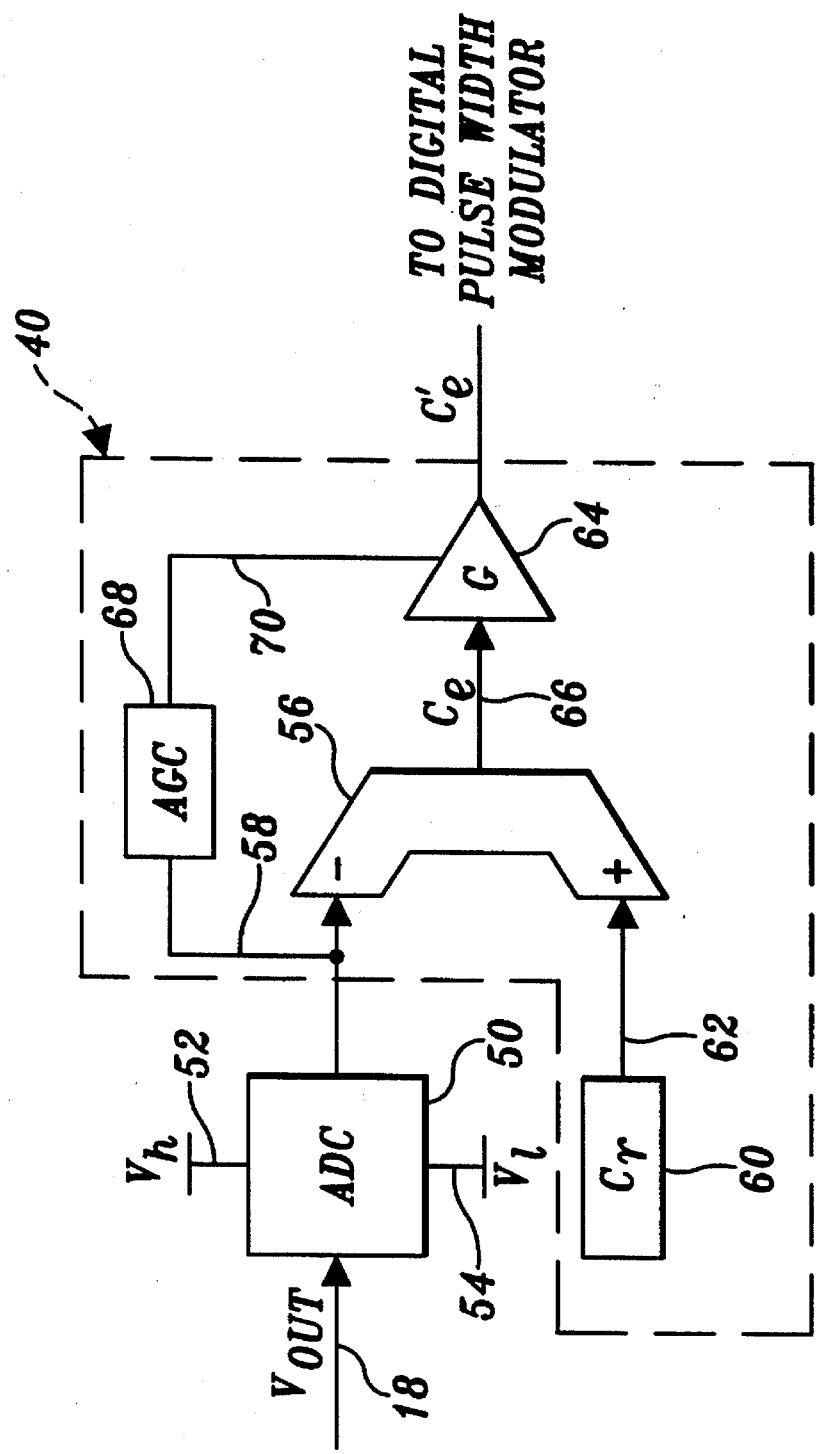
FIG. 4A is a schematic diagram of a signal processor used in the control of FIG. 3, showing the input of only one parameter that is monitored.

With reference to FIG. 4A, a block diagram illustrates the signal processing functions of signal processor 40. To simplify this figure, only ADC 50 is shown. This ADC digitizes the output voltage, $V_{OUT}$ of PWM switching power supply 12, but it will be apparent that the signal processor can readily be programmed to respond to the digital signal produced by the plurality of ADCs, each signal corresponding to a different one of the parameters of the PWM switching power supply that are being monitored (if it is desired to monitor more than one). The digital signal produced by ADC 50 is applied to a negative terminal of an adder 56. The positive terminal of adder 56 is coupled by lines 62 to a reference register 60, in which is stored a reference count, $C_r$. The reference count is supplied by the user as part of the data input to signal processor 40 through program/parameter lines 25. Different reference count values can be provided for each different parameter of the PWM switching power supply that is selectively monitored. Adder 56 subtracts the digital value supplied by ADC 50 from the corresponding reference count. The result of this subtraction is an error count, $C_e$, which is conveyed on a line 66 to the input of a multiplier 64. A similar process is employed using similar components, for each other parameter that is monitored, with a corresponding reference value for each parameter.

The multiplier value or gain, G, of multiplier 64 is controlled by a signal conveyed on a line 70 from an automatic gain control (AGC)68. An input to the AGC from the ADC is used to establish the value of G used by multiplier 64. AGC 68 determines whether the digital value output from ADC 50 is outside a predefined linear control range. Although the value of the gain G can be proportionally controlled as function of the magnitude of the digital value corresponding to the monitored parameter, preferably, only two values are used for the gain. For example, if ADC 50 has an 8-bit resolution and its linear control range is one volt, to monitor a nominal output voltage of 5 volts, the lower limit of it linear control, V, would be set to 4.5 volts, and its upper limit, $V_h$, would be set to 5.5 volts. The voltage resolution of the ADC is its linear conversion range divided by the number of possible digital codes at the output of the ADC. For this example, the voltage resolution equals 1,000 mV/256, which is approximately equal to 4 mV. If the digital value output from ADC 50 is outside the range from 4.5 volts through 5.5 volts, AGC 68 provides a second value for G that is input to multiplier 64, and this second value for G is substantially greater than the value provided when the digital value is within the linear control range of the ADC. By setting the gain higher when the parameter being monitored deviates substantially from a desired value and lower when the parameter is relatively close to the desired value, control 14 causes PWM switching power supply 12 to operate so that the monitored parameter more quickly achieves the desired value, and then the control of the PWM switching power supply is dampened to stabilize and maintain the parameter at its desired value. It should also be noted that if ADCs are used that have a wider linear control range, i.e., a control range corresponding to the operating range of the parameter in question, AGC 68 and multiplier 64 will not be required, and thus, are optional—depending upon the ADC(s) that are used. In any case, it will be apparent that for each parameter monitored, the appropriate control range is provided.

The output of multiplier 64 is the error count, $C_e'$, which is a digital value that is analogous to the analog error voltage that is usually input to a conventional analog pulse width modulator controller. If more than one parameter is being monitored, the values for $C_e'$ for each such parameter are summed together. In the present invention, the digital error count, $C_e'$, (or sum of the counts for all parameters monitored) is input to digital pulse width modulator 48. A first embodiment of the digital pulse width modulator is shown in FIG. 4B. This embodiment is implemented with GaAs technology or by using other materials/technology capable of operating at frequencies up to 1 GHz. The need for such a relatively high frequency operating capability is explained below.

The error count, $C_e'$ is input to a digital comparator 72 for comparison to a digital count produced by a pulse width counter 76. Pulse width counter 76 repetitively accumulates a linearly increasing count of cycles of the clock signal input on line 80. Each counting cycle starts when the pulse width counter is reset by a set signal applied on a line 86 from the output of another digital comparator 82. Digital comparator 82 has two inputs, one connected through a line 78 to the output of pulse width counter 76 and the other coupled through a line 85 to a frequency register 83. The set signal is produced by digital comparator 82 when the digital count developed by pulse width counter 76 equals a digital value referred to as the "Frequency In," which is stored in frequency register 83. This digital value, which is provided by the user and input to the frequency register of the digital pulse width modulator through a line 87, is selected so as to determine the repetition frequency, f, of the PWM control signal. The period, T, of square wave signal 36 (FIG. 2) comprising the PWM control signal is thus equal to 1/f.

As soon as the count produced by pulse width counter 76 equals the error count, $C_e'$, digital comparator 72 produces a reset signal conveyed on a line 86 that resets flip-flop 88, and thereby determines the duration of on-time, $T_{ON}$, for the square wave pulse output from the flip flop on line 20 comprising the PWM control signal. The next positive going square wave pulse is initiated when pulse width counter 76 is again reset by the set signal output from digital comparator 82; this set signal is also applied to the set terminal of flip-flop 88 through a line 84, so that it initiates the positive edge transition of the square wave pulse.

To understand the advantages and operation of digital pulse width modulator 48, it must be emphasized that the error signal, $C_e'$, is a digital value—not an analog signal, and that all processing of the error signal to determine the period and on-time of the square wave pulse used to control the PWM switching power supply is done in the digital domain.

The digital count accumulated by pulse width counter 76 corresponds to the number of clock cycles input to it from the external clock since the set signal was last applied to the reset terminal of the pulse width counter. Once the number of clock cycles counted by pulse width counter 76 equals the error count, $C_e'$, digital comparator 72 produces the reset signal that is coupled to the flip-flop reset terminal on a line 86. The occurrence of the reset signal terminates square wave pulse produced by the flip-flop and thus determines the duration of the on-time for the square wave pulse. It will be evident that as the error count produced by signal processor 40 increases in magnitude, the duration of the on-time, $T_{ON}$, of the square wave pulse increases proportionally, ensuring an increase in the magnitude of the output voltage of pulse width modulator power supply 12. Conversely, as the digital value of $C_e'$ decreases, the duration of the PWM control signal square wave pulse width decreases, reducing the magnitude of the monitored parameter of the PWM switching power supply. Any other monitored parameters contributing to the digital value of $C_e'$ are similarly controlled.

The ripple resolution, $R_o$, on the output signal of the pulse width modulator power supply is equal to the output voltage from transformer/rectifier circuit 22 (e.g., 28 volts DC), or alternatively equal to the DC input voltage from an external DC source, divided by the resolution of ADC 50, which is 4 millivolts in the above example. For these conditions, $R_o$ equals 7,000 counts. If the PWM switching power supply is operating at a frequency of 100 kHz, the resolution of the ripple on the output corresponds to a switching speed in control 14 of 7,000×100 KHz (i.e., 700 MHz), which is not normally obtainable with silicon CMOS technology. Although digital pulse width modulator 48 can be implemented as shown in FIG. 4B and produced as an application specific integrated circuit (ASIC) or by using discrete components fabricated in GaAs, a lower cost approach would allow silicon CMOS technology to be used.

Figure 5:
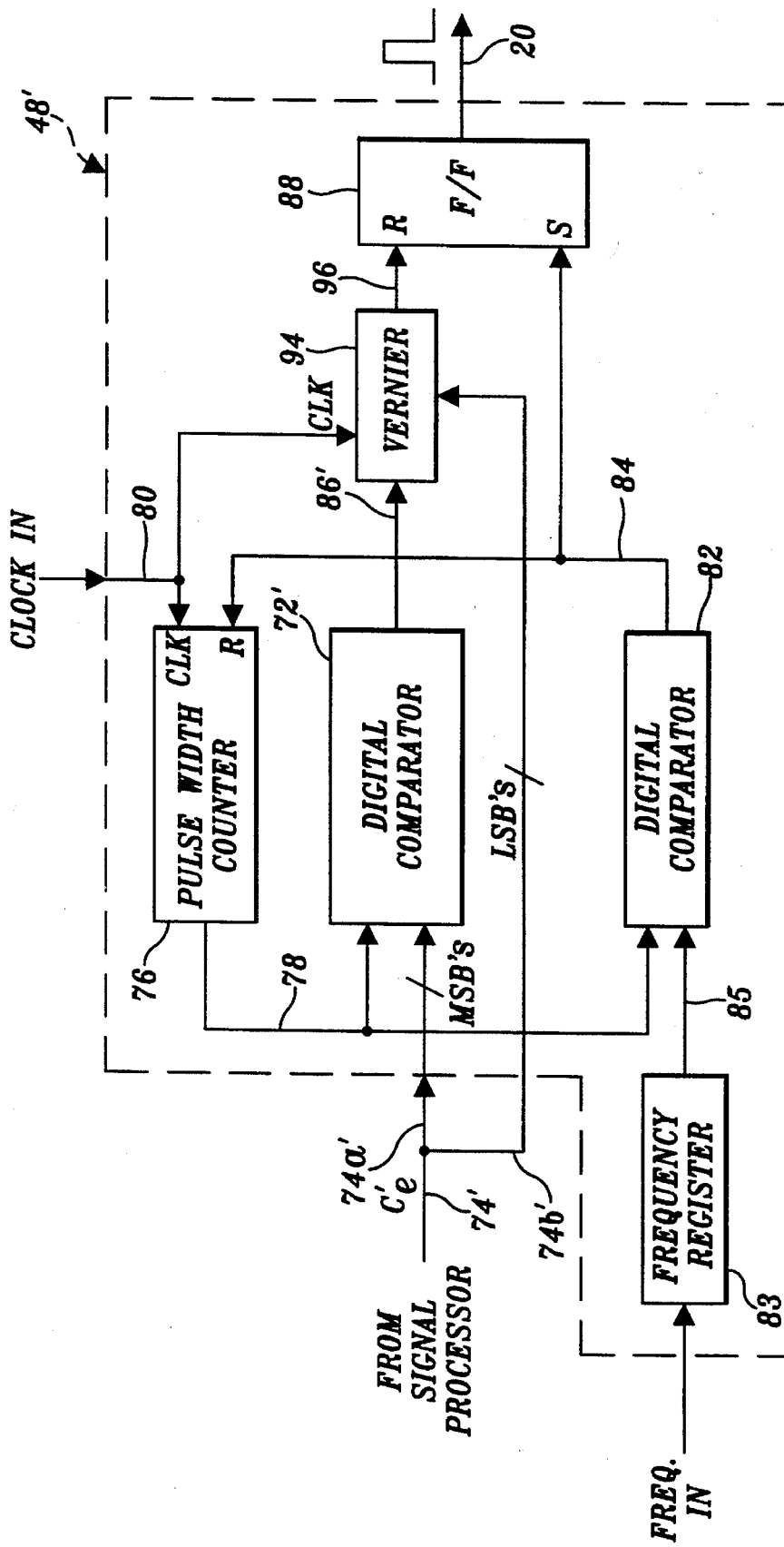
FIG. 5 is a schematic diagram of a second embodiment of the digital pulse width modulator, including a vernier to increase the resolution of the reset signal.

A digital pulse width modulator 48' shown in FIG. 5 is designed to be implemented in silicon CMOS technology and employs a vernier 94 to achieve the required control resolution without resorting to the relatively high switching frequencies employed in digital pulse width modulator 48. Comparison of digital pulse width modulator 48 in FIG. 4B with digital pulse width modulator 48' in FIG. 5 will make evident several other differences between the two embodiments. Since many of the same functional elements (although made using CMOS instead of GaAs technology) are used in digital pulse width modulator 48' as are used in the first embodiment of this component, these functional elements are identified with the same reference numerals in both FIGS. 4B and 5. Where differences in functionality of an element exists between the two embodiments, the element in question is identified with a reference numeral that includes a prime. For example, the reference numeral for a line 74' includes the prime notation when used in the Figure for the second embodiment of the digital pulse width modulator because in this embodiment, line 74' divides into a line 74a' and a line 74b'. Line 74a' conveys the most significant bits of the error count, $C_e'$, while line 74b' carries the least significant bits and is coupled to an input of vernier 94. The most significant bits conveyed on line 74a' are input to a digital comparator 72' for comparison against the count produced by pulse width counter 76. However, in pulse width modulator 48', instead of counting a clock frequency input on line 80 that might range between 500 MHz and 1 GHz, the external clock now provides a clock frequency that can range up to about 50 MHz, a frequency that is well within the operational capabilities of silicon CMOS technology.

Figure 6:
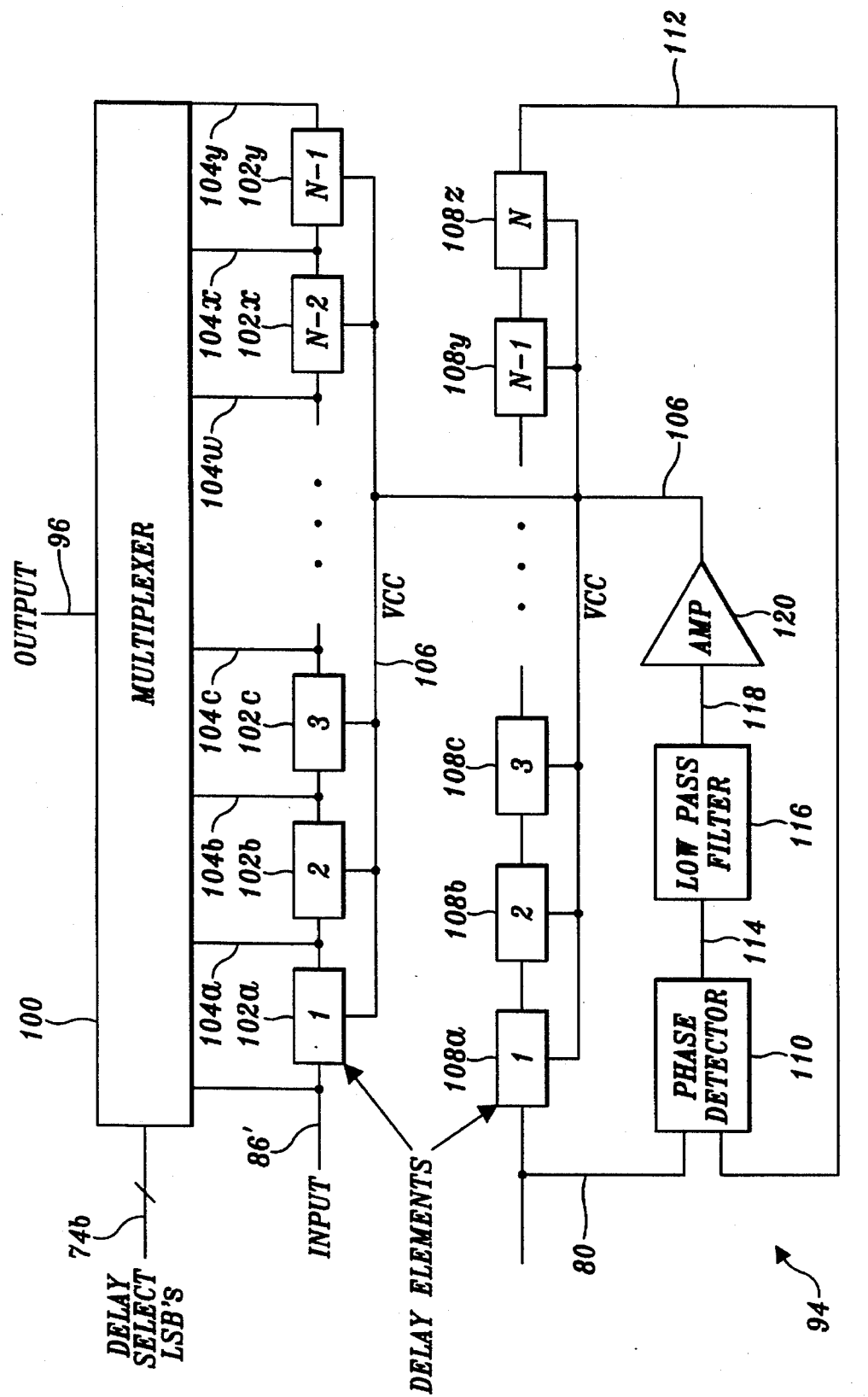
FIG. 6 is a schematic diagram of the vernier of FIG. 5.

In pulse width modulator 48', the required resolution is provided by vernier 94, which breaks down 20 nanosecond time intervals, corresponding to the period for each 50 MHz clock cycle, into one nanosecond time increments. Details of vernier 94 are shown in FIG. 6. In the preferred embodiment of vernier 94, a multiplexer (MUX) 100 is used to select a delay between 0 and N−1 units, where N is equal to the number of equal delay increments into which each clock cycle is to be divided to provide the desired resolution, e.g., 1 nanosecond for a 20 nanosecond clock cycle. The incremental delay is produced by delay elements 102, which in this embodiment, preferably comprise an even number of inverters connected in series, so that each inverter provides a T/N increment of resolution (delay). The particular duration of the delay applied to the input signal is determined in response to the least significant bits (LSBs) that are input to MUX 100 on lines 74b'. The input signal to MUX 100 that is delayed is determined by digital comparator 72' in response to the MSBs of the error count, $C_e'$, and this signal is delayed for a time corresponding to the LSBs of the error count when MUX 100 selects the number of successive inverters or delay elements 102 through which the input signal must pass before it is output on line 96 to the reset terminal of flip-flop 88 as a function of the LSBs.

Since the incremental delay provided by each of the inverters is process dependent and not inherently precisely equal to T/N, the delay must be controlled to achieve at least a total delay for all N inverters that is equal to T. In the disclosed preferred embodiment, the supply voltage, $V_{CC}$, to each of the inverters or delay elements 102 is controlled to provide the appropriate delay time. A greater supply voltage shortens the delay provided by each delay element; conversely, a lower supply voltage lengthens the delay time. In order to determine the appropriate supply voltage $V_{CC}$ for the inverters, a second set of N inverters or delay elements 108 is included, each of which is provided the same supply voltage. $V_{CC}$ as inverters used for delay elements 102. The clock signal on line 80 is input to delay element 108a and is delayed by successive delay elements 108b, 108c, etc., through the Nth delay element 108z, all of which are coupled in series. The signal output from the Nth delay element 108z is conveyed on a line 112 to the input of a phase detector 110, the other input being connected to receive the clock signal on line 80. Phase detector 110 determines the phase difference between the clock signal delayed by all N delay elements 108 and the clock signal that is not delayed. If the N delay elements 108 are providing the appropriate delay time, the delayed clock signal should be 360° out of phase with the undelayed clock signal, i.e., there should be substantially no apparent phase difference between the two signals, The difference in phase between the clock signal and the delayed clock signal input to phase detector 110 is conveyed on a line 114 to the input of a low pass filter 116. The low pass filter averages cycle-to-cycle variations in the phase difference, producing a filtered DC signal. The filtered DC signal from low pass filter 116 is supplied on a line 118 to an amplifier 120, the output of which is carried on line 106 to the $V_{CC}$ terminals of delay elements 102 and 108. This DC signal is the power supply for each of the delay elements and is thus controlled to achieve the approximate desired T/N incremental delays for each delay element. By carefully laying out the circuit comprising vernier 94, the delay times for each of the delay elements should match closely.

Figure 7:
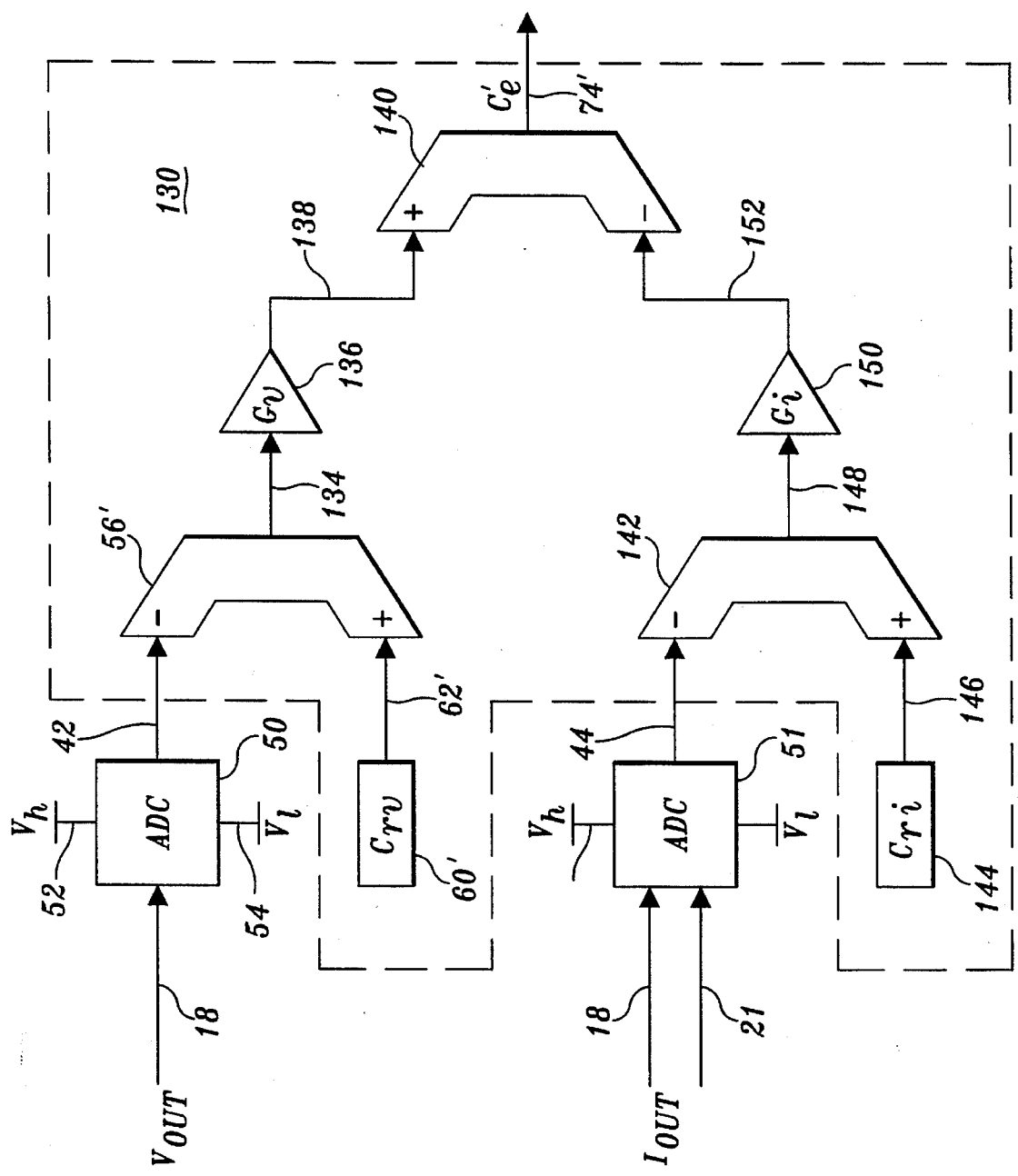
FIG. 7 is an alternative embodiment of the digital signal processor, using both output voltage and output current monitoring to determine an error count for providing a control signal to a pulse width modulated power supply.

In FIG. 7, a signal processor 130 is configured to monitor both output voltage and output current of the PWM switching power supply and to provide an error count that corresponds to the difference between the monitored values of output current and output voltage and reference values for each of these parameters. Signal processor 130 includes an adder 56' that is coupled to ADC 50 by lines 42, just as in the previously described embodiment for signal processor 40. A reference count register 60' stores a reference count for voltage, $C_{rv}$, that represents the digital value of the desired output voltage. Adder 56' determines the difference between the monitored digital value corresponding to the output voltage of the PWM switching power supply and this desired value; the digital difference is supplied to a multiplier 136. In this embodiment, multiplier 136 has a fixed gain, $G_v$, that is applied to the output of adder 56'. The resulting multiplied value is input to a positive terminal of an adder 140 on a line 138.

The digital value from ADC 51 is input through lines 44 to the negative terminal of an adder 142, and a reference current count is coupled to the positive terminal of adder 142 through lines 146. Adder 142 determines the difference between the digital value corresponding to the output current of the PWM switching power supply provided by ADC 51 and a reference current count, $C_{ri}$, that is stored in a reference count register 144. The digital difference between these two values is conveyed through lines 148 to the input of a multiplier 150, having a fixed gain, $G_i$. The negative terminal of adder 140 is coupled through a line 152 to the output of multiplier 150. Adder 140 thus determines the digital difference between the multiplied voltage error provided by multiplier 136 and the multiplied amplified current error from multiplier 150; this difference is output on lines 74' to the digital pulse width modulator, to determine the duration of the PWM control signal that it produces for controlling PWM switching power supply 12. The output voltage and current errors affect the pulse width on-time, $T_{ON}$, in opposite ways. When the output voltage is high and/or the output current is low, the duration of the on-time is shortened. Conversely, when the output voltage is low and/or the output current is high, the duration of the on-time is increased.

Figure 8:
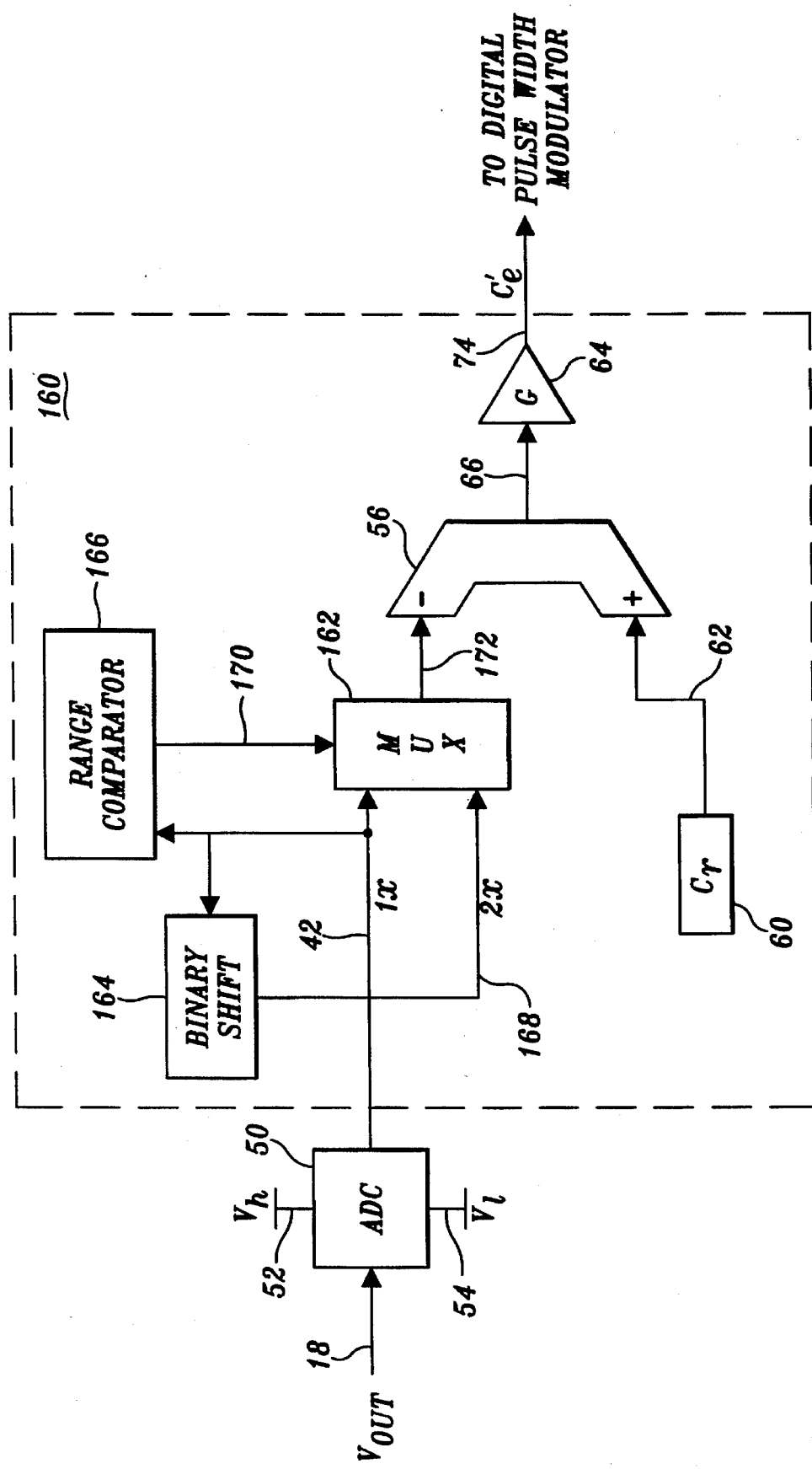
FIG. 8 is an alternative embodiment of the an automatic gain control applied to a monitored parameter of the pulse code modulated power supply.

An alternative embodiment of the AGC as implemented in a signal processor 160, is illustrated in FIG. 8. In this embodiment, instead of multiplying the difference between the selected parameter and the reference count, the digital signal provided by the ADC is selectively scaled as a function of the magnitude of the digital signal. For the preferred embodiment shown in this Figure, the digital value corresponding to the output voltage, $V_{OUT}$, is conveyed by lines 42 to one input of a MUX 162, and to both a binary shift block 164 and a range comparator 166. The range comparator determines if the digital value provided by ADC 52 is equal to or outside the limits of its linear control range, i.e., whether its output is all binary ones. If so, range comparator 166 produces a select signal that is input to MUX 162 on a line 170, causing it to select the output of binary shift block 164, which is conveyed on lines 168. Binary shift block 164 shifts the digital value at its input to the right with a zero fill, producing a value that is twice that input to the binary shift block. For example, the binary value 1111 1111 (255 in decimal notation) would be multiplied by two through this operation, producing the binary value 1 1111 1110 (510 in decimal notation). If the digital value from ADC 50 is within its linear control range, range comparator 166 produces a select signal that causes MUX 162 to select the digital value that is not multiplied by two. The output of MUX 162 is conveyed on lines 172 to the negative terminal of adder 56 and subtracted from the reference count stored in count register 60, producing a difference that is multiplied by a fixed gain, G, in multiplier 64.

It will be recognized that a MUX with additional inputs can be provided and a corresponding number of additional binary shift blocks can be provided to produce a greater range in the gain selectively enabled by the MUX as a function of the decimal value output from the ADC. Alternatively, MUX 162 can be replaced with a variable gain multiplier and range comparator 166 and with a signal processor that determines the gain to apply based upon the magnitude of the digital signal provided by the ADC.

While the preferred embodiment of the invention has been illustrated and described in connection with several preferred embodiments, it will be appreciated that further changes can be made therein without departing from the spirit and scope of the invention. Accordingly, it is intended that the scope of the invention not be limited by the disclosure of the preferred embodiment, but instead, be determined entirely by reference to the claims that follow.

The embodiments of the invention in which an exclusive property or privilege is claimed are defined as follows:

1. A control for a pulse width modulated power supply, comprising:

(a) an analog-to-digital converter having an input adapted to monitor a parameter of the pulse width modulated power supply, producing a corresponding digital signal;

(b) a reference register in which is stored a reference value that is determined as a function of a desired value of the parameter for the pulse width modulated power supply;

(c) an adder having a first input coupled to the analog-to-digital converter to receive the digital signal and a second input coupled to the reference register to receive the reference value stored therein, said adder determining a digital error signal corresponding to a difference between the digital signal and the reference value;

(d) a clock that produces a clock signal comprising a plurality of pulses;

(e) a counter that has an input coupled to the clock, to receive the clock signal, said counter producing a digital count of the pulses comprising the clock signal;

(f) a digital comparator having an output, a first input coupled to receive the digital error signal, and a second input coupled to receive the digital count, said digital comparator producing a reset signal on its output when the digital count equals the digital error signal; and (g) a gate circuit having an input coupled to the output of the digital comparator to receive the reset signal and an output, said gate circuit producing a control pulse having a width determined as a function of the reset signal, so that a magnitude of the analog voltage produced by a pulse width modulated power supply coupled to receive the control pulse is determined by the width of the control pulse.

2. The control of claim 1, further comprising at least one other analog-to-digital converter adapted to couple to the pulse width modulated power supply to monitor a different parameter indicative of the operation of the pulse width modulated power supply and to produce a different digital signal indicative of said different parameter.

3. The control of claim 2, further comprising at least one other reference register in which is stored a register value corresponding to a desired value for the different parameter.

4. The control of claim 3, further comprising means for combining a plurality of different digital signals indicative of a plurality of corresponding different parameters of the pulse width modulated power supply that are monitored, wherein said plurality of different parameters include an input voltage, an input current, an output voltage, and an output current of the pulse width modulated power supply.

5. The control of claim 1, further comprising a multiplier coupled to the output of the adder to receive the error signal, and an automatic gain control that is coupled to the output of the analog-to-digital converter to receive the digital signal and in response to the digital signal, providing a gain value that is input to the multiplier for multiplying the error signal to produce a multiplied error signal that is supplied to the first input of the digital comparator.

6. The control of claim 5, wherein the gain value is proportional to a magnitude of the digital signal produced by the analog-to-digital converter.

7. The control of claim 1, further comprising means for producing a set signal, said set signal being coupled to a set terminal of the gate circuit to initiate the control pulse, and to a reset terminal of the counter to initiate its digital count.

8. The control of claim 1, wherein said error signal comprises a plurality of least significant bits and most significant bits, further comprising a vernier coupled between the output of the digital comparator and the input of the gate circuit, said vernier being coupled to receive the plurality of least significant bits of the error signal, and in response thereto, delaying the reset signal by a time interval having a duration corresponding to a value of the plurality of least significant bits of the error signal, said vernier thereby providing greater resolution in controlling the width of the control pulse.

9. The control of claim 8, wherein the vernier includes a plurality of delay elements coupled to a multiplexer, said multiplexer responding to the least significant bits of the error signal to select a specific number of delay elements to apply in delaying the reset signal, each delay element providing an incremental delay to the reset signal.

10. The control of claim 1, wherein the gate circuit comprises a flip-flop.

11. A control for a pulse width modulated power supply, comprising:

(a) means adapted to couple to the pulse width modulated power supply, for monitoring a plurality of operational parameters of the pulse width modulated power supply, producing corresponding digital values for each operational parameter that is monitored, the plurality of operational parameters including at least two operational parameters from the group consisting of an input voltage, an input current, an output voltage, and an output current of the pulse width modulated power supply;

(b) digital processing means, coupled to receive the corresponding digital values and to receive a predetermined desired reference value for each digital value, for determining a digital difference between the predetermined desired reference value and the digital value; and (c) a digital pulse width modulator that is coupled to receive the digital difference for each operational parameter that is monitored and in response thereto, producing a pulse width control signal having a pulse width that is variable, the pulse width control signal controlling said at least one operational parameter of the pulse width modulated power supply.

12. The control of claim 11, wherein the means for monitoring include means for combining digital values corresponding to each of a plurality of the operational parameters of the pulse width modulated power supply.

13. The control of claim 11, wherein the means for monitoring include a multiplier having a gain selected as a function of a magnitude of at least one digital signal indicative of said at least one operational parameter of the pulse width modulated power supply that is monitored.

14. A method for controlling a pulse width modulated power supply, comprising the steps of:

(a) sampling a parameter of the pulse width modulated power supply to produce corresponding digital values;

(b) providing a reference value determined so as to correspond to a desired magnitude of the parameter for the pulse width modulated power supply;

(c) determining a difference between the digital value and the reference value;

(d) producing a count signal corresponding to a count of clock pulses;

(e) digitally comparing the difference between the digital value and the reference value with the count signal;

(f) producing a reset signal when said difference digitally equals said count signal; and (g) producing a control pulse having a width determined in response to the reset signal, said control pulse being provided to the pulse width modulated power supply to control a magnitude of the parameter.

15. The method of claim 14, further comprising the step of monitoring a plurality of parameters of the pulse width modulated power supply to produce corresponding digital values for use in determining the width of the control pulse.

16. The method of claim 14, further comprising the step of multiplying the difference by a gain factor determined in response to the digital value, producing a modified error signal that is compared with the count signal.

17. The method of claim 16, wherein the gain factor has a first value when the digital value is outside a predefined range, and a second value when the digital value is within the predefined range.

18. The method of claim 14, further comprising the step of producing a set signal that initiates the control pulse and resets the count signal.

19. The method of claim 18, further including the step of delaying the reset signal for an interval of time determined as a function of the difference between the digital value and the reference value.

20. The method of claim 14, further comprising the steps of splitting the difference between the digital value and the reference value into a plurality of most significant bits and a plurality of least significant bits; wherein the step of digitally comparing comprises the step of comparing only the most significant bits of the difference signal to the count signal, further comprising the step of delaying the reset signal by a duration of time determined as a function of the plurality of least significant bits of the difference signal.

21. The method of claim 20, wherein the step of delaying a lower frequency clock pulse is used to achieve substantially the same resolution as can be achieved using a substantially higher frequency clock pulse, when determining the width of the control pulse.

22. The method of claim 14, wherein at least one of an input voltage, an input current, an output voltage, and an output current of the pulse width modulated power supply are sampled to determine the width of the control pulse.

23. A control for a pulse width modulated power supply, comprising:

(a) means adapted to couple to the pulse width modulated power supply, for monitoring at least one operational parameter of the pulse width modulated power supply, producing corresponding digital values for each operational parameter that is monitored;

(b) digital processing means, coupled to receive the corresponding digital values and to receive a predetermined desired reference value for each digital value, for determining a digital difference between the predetermined desired reference value and the digital value; and (c) a digital pulse width modulator that is coupled to receive the digital difference for each operational parameter that is monitored and in response thereto, producing a pulse width control signal having a pulse width that is variable, the pulse width control signal controlling said at least one operational parameter of the pulse width modulated power supply, the digital pulse width modulator including a digital counter that accumulates a count of pulses, and a digital comparator that compares the count to the digital difference between the predetermined desired reference count and the digital count corresponding to said at least one operational parameter of the pulse width modulated power supply, said digital comparator producing a reset signal when the count of pulses equals the digital difference.

24. The control of claim 23, wherein the digital pulse width modulator includes a gating circuit that produces a control pulse in response to a set signal, the duration of the control pulse being affected by application of the reset signal, said control pulse being used to control the pulse width modulated power supply.

25. The control of claim 24, wherein the pulse width modulator further includes a vernier coupled between the digital comparator and the gating circuit, said vernier providing increased resolution in determining a time at which the reset signal is applied to the gating circuit.

26. The control of claim 25, wherein the vernier comprises a plurality of delay elements coupled to the digital comparator to receive the reset signal, and means for selecting a specific number of the delay elements for use in delaying the reset signal, as a function of the digital difference between the predetermined desired reference count and the digital count.

27. The control of claim 24, wherein the digital pulse width modulator further comprises means for producing the set signal in response to the count of pulses and as a function of a predetermined reference count, said set signal being applied to the digital counter to initiate the count of pulses and being applied to the gating circuit to initiate the control pulse.

* * * * *